(12) United States Patent
Imai (10) Patent No.: US 9,231,377 B2
(45) Date of Patent: Jan. 5, 2016

(54) VERTICAL CAVITY SURFACE EMITTING LASER AND ATOMIC OSCILLATOR

(71) Applicant: Seiko Epson Corporation, Tokyo (JP)

(72) Inventor: Yasutaka Imai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/575,071

(22) Filed: Dec. 18, 2014

(65) Prior Publication Data

US 2015/0180211 A1    Jun. 25, 2015

(30) Foreign Application Priority Data

Dec. 20, 2013  (JP) .................................. 2013-263461

(51) Int. Cl.
*H01S 5/00* (2006.01)
*H01S 5/42* (2006.01)

(52) U.S. Cl.
CPC ........................................ *H01S 5/42* (2013.01)

(58) Field of Classification Search
USPC ......... 372/43.01, 45.01, 46.01, 50.11, 50.124
See application file for complete search history.

(56) References Cited

U.S. PATENT DOCUMENTS 6,134,251 A    10/2000  Kawase et al.
2010/0111125 A1*  5/2010  Kondo .................. 372/45.01

FOREIGN PATENT DOCUMENTS

JP    11-054838 A    2/1999

* cited by examiner

*Primary Examiner* — Dung Nguyen
(74) *Attorney, Agent, or Firm* — Harness, Dickey & Pierce, P.L.C.

(57) ABSTRACT

A vertical cavity surface emitting laser includes: a substrate; and a laminated body which is provided over the substrate, wherein the laminated body includes a first mirror layer, an active layer, and a second mirror layer, in a plan view, the laminated body includes a first distortion imparting portion, a second distortion imparting portion, and a resonance portion which is provided between the first distortion imparting portion and the second distortion imparting portion and resonates light generated by the active layer, and an angle formed by a side surface of the first distortion imparting portion and an upper surface of the substrate, and an angle formed by a side surface of the second distortion imparting portion and the upper surface of the substrate are greater than an angle formed by a side surface of the resonance portion and the upper surface of the substrate.

4 Claims, 8 Drawing Sheets

VERTICAL CAVITY SURFACE EMITTING LASER AND ATOMIC OSCILLATOR

BACKGROUND

1. Technical Field

The present invention relates to a vertical cavity surface emitting laser and an atomic oscillator.

2. Related Art

The vertical cavity surface emitting laser (VCSEL) is, for example, used as a light source of the atomic oscillator using coherent population trapping (CPT) which is one of the quantum interference effects.

In the vertical cavity surface emitting laser, a resonator generally has an isotropic structure, and accordingly it is difficult to control a polarization direction of laser light emitted from the resonator. JP-A-11-54838, for example, discloses a vertical cavity surface emitting laser which generates distortion in a resonator by a distortion imparting portion and causes double refraction to occur, so as to stabilize a polarization direction of laser light obtained by laser oscillation.

However, in the vertical cavity surface emitting laser disclosed in JP-A-11-54838, an angle formed by a side surface of the distortion imparting portion and a substrate has not been considered. Accordingly, in the vertical cavity surface emitting laser disclosed in JP-A-11-54838, stress applied to a vertical resonator is not sufficient, and thus the polarization direction of the laser light may not be stabilized.

SUMMARY

An advantage of some aspects of the invention is to provide a vertical cavity surface emitting laser which can stabilize a polarization direction. In addition, another advantage of some aspects of the invention is to provide an atomic oscillator including the vertical cavity surface emitting laser.

An aspect of the invention is directed to a vertical cavity surface emitting laser including: a substrate; and a laminated body which is provided over the substrate, in which the laminated body includes a first mirror layer which is provided over the substrate, an active layer which is provided over the first mirror layer, and a second mirror layer which is provided over the active layer, in a plan view, the laminated body includes a first distortion imparting portion, a second distortion imparting portion, and a resonance portion which is provided between the first distortion imparting portion and the second distortion imparting portion and resonates light generated by the active layer, and an angle formed by a side surface of the first distortion imparting portion and an upper surface of the substrate, and an angle formed by a side surface of the second distortion imparting portion and the upper surface of the substrate are both greater than an angle formed by a side surface of the resonance portion and the upper surface of the substrate.

According to the vertical cavity surface emitting laser, since the angle formed by the side surface of the first distortion imparting portion and the upper surface of the substrate, and the angle formed by the side surface of the second distortion imparting portion and the upper surface of the substrate are both greater than the angle formed by the side surface of the resonance portion and the upper surface of the substrate, it is possible to increase stress to be applied to the resonance portion by the first distortion imparting portion and the second distortion imparting portion, and thus it is possible to generate a large amount of distortion to the active layer of the resonance portion. Therefore, in the vertical cavity surface emitting laser, it is possible to stabilize a polarization direction of laser light.

In the description according to the invention, for example, when a phrase "over" is used in a sentence such as "to form a specific element (hereinafter, referred to as a "B") over another specific element (hereinafter, referred to as an "A")", the phrase "over" is used to include a case of forming the B directly on the A and a case of forming the B on the A with another element interposed therebetween.

In the vertical cavity surface emitting laser according to the aspect of the invention, the first distortion imparting portion may have a first width, the second distortion imparting portion may have a second width, and the resonance portion may have a third width greater than at least one of the first width and the second width.

According to the vertical cavity surface emitting laser with this configuration, it is possible to increase the stress to be applied to the resonance portion by the first distortion imparting portion and the second distortion imparting portion, and thus it is possible to generate a large amount of distortion to the active layer of the resonance portion. Therefore, in the vertical cavity surface emitting laser, it is possible to stabilize the polarization direction of the laser light.

Another aspect of the invention is directed to an atomic oscillator including: the vertical cavity surface emitting laser according to the aspect of the invention.

According to the atomic oscillator, since the atomic oscillator includes the vertical cavity surface emitting laser according to the aspect of the invention, it is possible to stably emit circularly polarized light to a gas cell through a λ/4 plate, for example, and it is possible to increase frequency stability of the atomic oscillator.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to unduly limit the contents of the invention disclosed in the aspects. All of the configurations described below are not limited to be essential constituent elements of the invention.

1. Vertical Cavity Surface Emitting Laser

Figure 1:
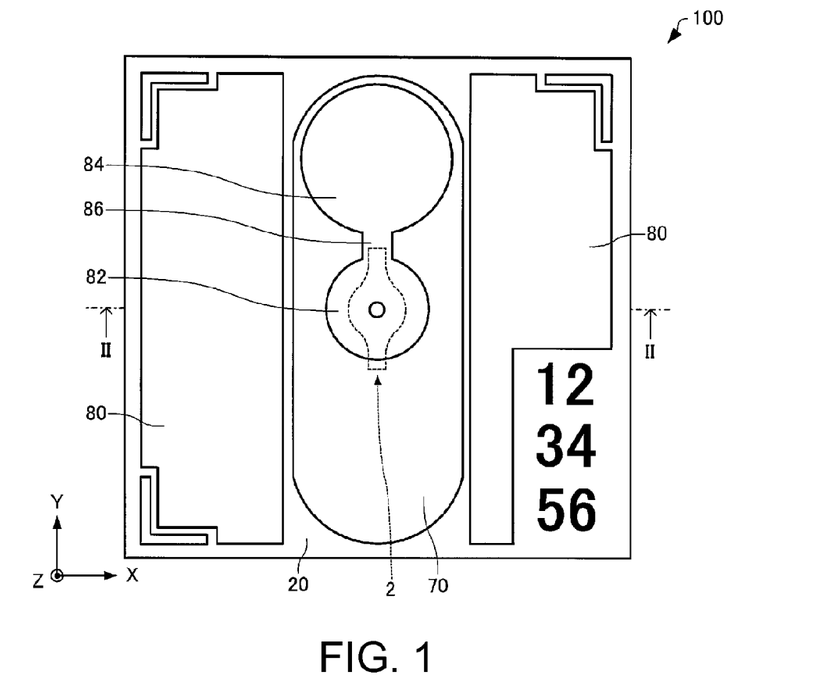
FIG. 1 is a plan view schematically showing a vertical cavity surface emitting laser according to an embodiment.
Figure 2:
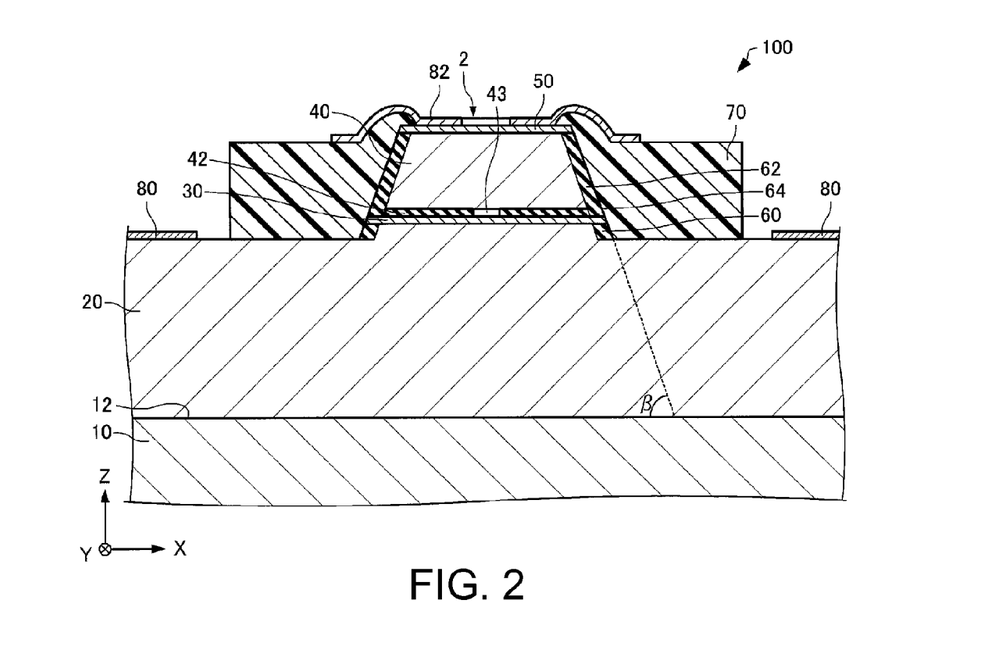
FIG. 2 is a cross-sectional view schematically showing the vertical cavity surface emitting laser according to the embodiment.
Figure 3:
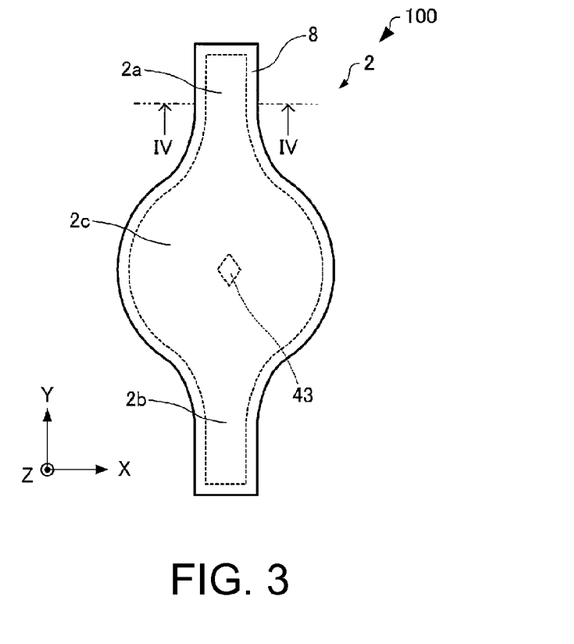
FIG. 3 is a plan view schematically showing the vertical cavity surface emitting laser according to the embodiment.
Figure 4:
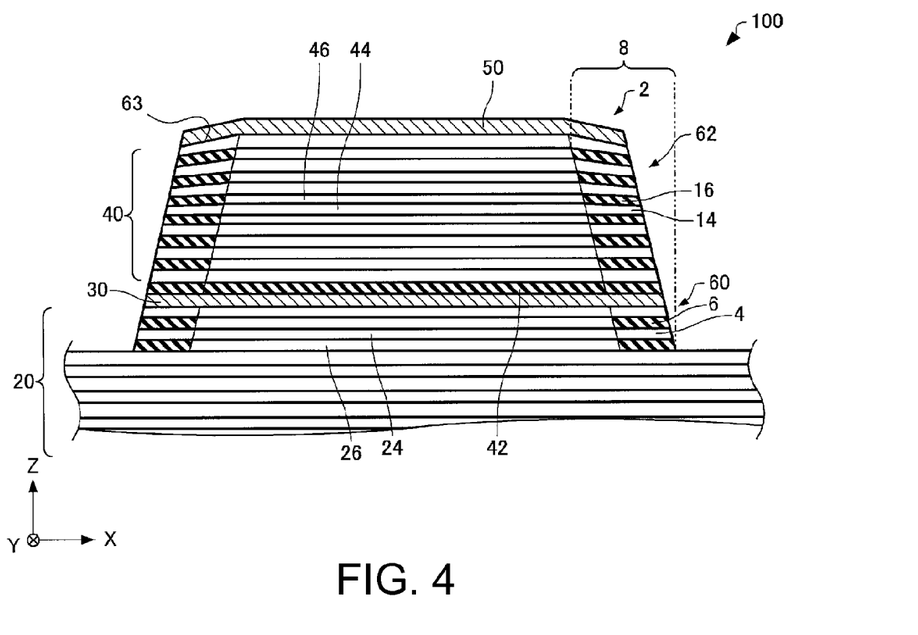
FIG. 4 is a cross-sectional view schematically showing the vertical cavity surface emitting laser according to the embodiment.

First, a vertical cavity surface emitting laser according to the embodiment will be described with reference to the drawings. FIG. 1 is a plan view schematically showing a vertical cavity surface emitting laser 100 according to the embodiment. FIG. 2 is a cross-sectional view which is taken along line II-II of FIG. 1 and schematically shows the vertical cavity surface emitting laser 100 according to the embodiment. FIG. 3 is a plan view schematically showing the vertical cavity surface emitting laser 100 according to the embodiment. FIG. 4 is a cross-sectional view which is taken along line IV-IV of FIG. 3 and schematically shows the vertical cavity surface emitting laser 100 according to the embodiment.

For the sake of convenience, FIG. 2 shows a simplified laminated body 2. In FIG. 3, members other than the laminated body 2 of the vertical cavity surface emitting laser 100 are omitted. FIGS. 1 to 4 show an X axis, a Y axis, and a Z axis as three axes orthogonal to each other.

As shown in FIGS. 1 to 4, the vertical cavity surface emitting laser 100 includes a substrate 10, a first mirror layer 20, an active layer 30, a second mirror layer 40, a current constriction layer 42, a contact layer 50, first areas 60, second areas 62, a resin layer (insulation layer) 70, first electrodes 80, and second electrodes 82.

The substrate 10 is, for example, a first conductive (for example, n-type) GaAs substrate.

The first mirror layer 20 is formed on the substrate 10. The first mirror layer 20 is a first conductive semiconductor layer. As shown in FIG. 4, the first mirror layer 20 is a distribution Bragg reflection (DBR) type mirror in which high refractive index layers 24 and low refractive index layers 26 are laminated onto each other. The high refractive index layer 24 is, for example, an n-type $A_{0.12}Ga_{0.88}As$ layer on which silicon is doped. The low refractive index layer 26 is, for example, an n-type $Al_{0.9}Ga_{0.1}As$ layer on which silicon is doped. The number (number of pairs) of laminated high refractive index layers 24 and low refractive index layers 26 is, for example, 10 pairs to 50 pairs, specifically, 40.5 pairs.

The active layer 30 is provided on the first mirror layer 20. The active layer 30, for example, has a multiple quantum well (MQW) structure in which three layers having a quantum well structure configured with an i-type $In_{0.06}Ga_{0.94}As$ layer and an i-type $Al_{0.3}Ga_{0.7}As$ layer are overlapped.

The second mirror layer 40 is formed on the active layer 30. The second mirror layer 40 is a second conductive (for example, p-type) semiconductor layer. The second mirror layer 40 is a distribution Bragg reflection (DBR) type mirror layer in which high refractive index layers 44 and low refractive index layers 46 are laminated onto each other. The high refractive index layer 44 is, for example, a p-type $Al_{0.12}Ga_{0.88}As$ layer on which carbon is doped. The low refractive index layer 46 is, for example, a p-type $Al_{0.9}Ga_{0.1}As$ layer on which carbon is doped. The number (number of pairs) of laminated high refractive index layers 44 and low refractive index layers 46 is, for example, 3 pairs to 40 pairs, specifically, 20 pairs.

The second mirror layer 40, the active layer 30, and the first mirror layer 20 configure a vertical resonator-type pin diode. When a forward voltage of the pin diode is applied between the first electrode 80 and the second electrode 82, recombination between electrons and positive holes occurs in the active layer 30, and the light emitting occurs. The light generated in the active layer 30 reciprocates between the first mirror layer 20 and the second mirror layer 40 (multiple reflection), the induced emission occurs at that time, and the intensity is amplified. When an optical gain exceeds an optical loss, laser oscillation occurs, and the laser light is emitted in a vertical direction (a lamination direction of the first mirror layer 20 and the active layer 30) from the upper surface of the contact layer 50.

The current constriction layer 42 is provided between the first mirror layer 20 and the second mirror layer 40. In the example shown in the drawing, the current constriction layer 42 is provided on the active layer 30. The current constriction layer 42 can also be provided in the first mirror layer 20 or the second mirror layer 40. In this case as well, the current constriction layer 42 is assumed to be provided between the first mirror layer 20 and the second mirror layer 40. The current constriction layer 42 is an insulation layer in which an opening 43 is formed. The current constriction layer 42 can prevent spreading of the current injected to a vertical resonator by the first electrode 80 and the second electrode 82 in a planar direction (direction orthogonal to the lamination direction of the first mirror layer 20 and the active layer 30).

The contact layer 50 is provided on the second mirror layer 40. The contact layer 50 is a second conductive semiconductor layer. Specifically, the contact layer 50 is a p-type GaAs layer on which carbon is doped.

As shown in FIG. 4, the first areas 60 are provided on lateral portions of the first mirror layer 20 configuring the laminated body 2. The first areas 60 include a plurality of oxide layers 6 which are provided to be connected to the first mirror layer 20 (in the example shown in the drawing, a part of the first mirror layer 20). Specifically, the first areas 60 are configured with the oxide layers 6 obtained by oxidizing layers connected to the low refractive index layers (for example, $Al_{0.9}Ga_{0.1}As$ layers) configuring the first mirror layer 20, and layers 4 connected to the high refractive index layers 24 (for example, $Al_{0.12}Ga_{0.88}As$ layers) configuring the first mirror layer 20 which are laminated on each other.

The second areas 62 are provided on lateral portions of the second mirror layer 40 configuring the laminated body 2. The second areas 62 include a plurality of oxide layers 16 which are provided to be connected to the second mirror layer 40. Specifically, the second areas 62 are configured with the oxide layers 16 obtained by oxidizing layers connected to the low refractive index layers 46 (for example, $Al_{0.9}Ga_{0.1}As$ layers) configuring the second mirror layer 40, and layers 14 connected to the high refractive index layers 44 (for example, $Al_{0.12}Ga_{0.88}As$ layers) configuring the second mirror layer 40 which are laminated on each other. In a plan view (when seen from the lamination direction of the first mirror layer 20 and the active layer 30), oxide areas 8 are configured by the first areas 60 and the second areas 62.

The first mirror layer 20, the active layer 30, the second mirror layer 40, the current constriction layer 42, the contact layer 50, the first areas 60, and the second areas 62 configure the laminated body 2. In the example shown in FIGS. 1 and 2, the laminated body 2 is surrounded with the resin layer 70.

In the example shown in FIG. 3, in a plan view, a length of the laminated body 2 in a Y axis direction is greater than a length of the laminated body 2 in an X axis direction. That is, a longitudinal direction of the laminated body 2 is the Y axis direction. In a plan view, the laminated body 2 is, for example, symmetrical about a virtual straight line which passes through the center of the laminated body 2 and is parallel to the X axis. In a plan view, the laminated body 2 is, for example, symmetrical about a virtual straight line which passes through the center of the laminated body 2 and is parallel to the Y axis.

In a plan view as shown in FIG. 3, the laminated body 2 includes a first distortion imparting portion (first portion) 2a, a second distortion imparting portion (second portion) 2b, and a resonance portion (third portion) 2c.

In a plan view, the first distortion imparting portion 2a and the second distortion imparting portion 2b face each other in the Y axis direction with the resonance portion 2c interposed therebetween. In a plan view, the first distortion imparting portion 2a is protruded from the resonance portion 2c in the positive Y axis direction. In a plan view, the second distortion imparting portion 2b is protruded from the resonance portion 2c in the negative Y axis direction. The first distortion imparting portion 2a and the second distortion imparting portion 2b are provided to be integrated with the resonance portion 2c.

The first distortion imparting portion 2a and the second distortion imparting portion 2b impart distortion to the active layer 30 and polarize light generated in the active layer 30. Herein, to polarize the light is to set a vibration direction of an electric field of the light to be constant. The semiconductor layers (the first mirror layer 20, the active layer 30, the second mirror layer 40, the current constriction layer 42, the contact layer 50, the first areas 60, and the second areas 62) configuring the first distortion imparting portion 2a and the second distortion imparting portion 2b are a generation source which generates distortion to be imparted to the active layer 30. Since the first distortion imparting portion 2a and the second distortion imparting portion 2b include the first areas 60 including the plurality of oxide layers 6 and the second areas 62 including the plurality of oxide layers 16, it is possible to impart a large amount of distortion to the active layer 30.

The resonance portion 2c is provided between the first distortion imparting portion 2a and the second distortion imparting portion 2b. A length of the resonance portion 2c in the X axis direction is greater than a length of the first distortion imparting portion 2a in the X axis direction or a length of the second distortion imparting portion 2b in the X axis direction. A planar shape of the resonance portion 2c (shape when seen from the lamination direction of the first mirror layer 20 and the active layer 30) is, for example, a circle.

Herein, the length of the resonance portion 2c in the X axis direction is, for example, the greatest length along the length of the resonance portion 2c in the X axis direction. The length of the first distortion imparting portion 2a in the X axis direction is, for example, the greatest length along the length of the first distortion imparting portion 2a in the X axis direction. The length of the second distortion imparting portion 2b in the X axis direction is, for example, the greatest length along the length of the second distortion imparting portion 2b in the X axis direction.

The resonance portion 2c resonates light generated in the active layer 30. That is, the vertical resonator is formed in the resonance portion 2c.

The resin layer 70 is provided at least on side surfaces of the laminated body 2. In the example shown in FIG. 1, the resin layer 70 covers the first distortion imparting portion 2a and the second distortion imparting portion 2b. That is, the resin layer 70 is provided on the side surface of the first distortion imparting portion 2a, the upper surface of the first distortion imparting portion 2a, the side surface of the second distortion imparting portion 2b, and the upper surface of the second distortion imparting portion 2b. The resin layer 70 may completely cover the first distortion imparting portion 2a and the second distortion imparting portion 2b, or may cover some of the first distortion imparting portion 2a and the second distortion imparting portion 2b. The material of the resin layer 70 is, for example, polyimide. In the embodiment, the resin layer 70 is used for applying the distortion to the first distortion imparting portion 2a and the second distortion imparting portion 2b, but since a configuration corresponding to the resin layer 70 is only necessary to have a function of insulating, the resin may not be used, as long as it is an insulation material.

In the example shown in FIG. 3, in a plan view, a length of the resin layer 70 in the Y axis direction is greater than a length of the resin layer 70 in the X axis direction. That is, a longitudinal direction of the resin layer 70 is the Y axis direction. The longitudinal direction of the resin layer 70 and the longitudinal direction of the laminated body 2 coincide with each other.

The first electrodes 80 are provided on the first mirror layer 20. The first electrodes 80 form ohmic contact with the first mirror layer 20. The first electrodes 80 are electrically connected to the first mirror layer 20. As the first electrodes 80, an electrode in which a Cr layer, an AuGe layer, an Ni layer, and an Au layer are laminated in this order from the first mirror layer 20 side is used, for example. The first electrodes 80 are the electrodes for injecting the current to the active layer 30. Although not shown, the first electrodes 80 may be provided on the lower surface of the substrate 10.

The second electrodes 82 are provided on the contact layer 50 (on the laminated body 2). The second electrodes 82 form ohmic contact with the contact layer 50. In the example shown in the drawing, the second electrodes 82 are also formed on the resin layer 70. The second electrodes 82 are electrically connected to the second mirror layer 40 through the contact layer 50. As the second electrodes 82, an electrode in which a Cr layer, a Pt layer, a Ti layer, a Pt layer, and an Au layer are laminated in this order from the contact layer 50 side is used, for example. The second electrodes 82 are the other electrodes for injecting the current to the active layer 30.

The second electrodes 82 are electrically connected to a pad 84. In the example shown in the drawing, the second electrodes 82 are electrically connected to the pad 84 through a lead-out wiring 86. The pad 84 is provided on the resin layer 70. The material of the pad 84 and the lead-out wiring 86 is, for example, the same as the material of the second electrodes 82.

Figure 5:
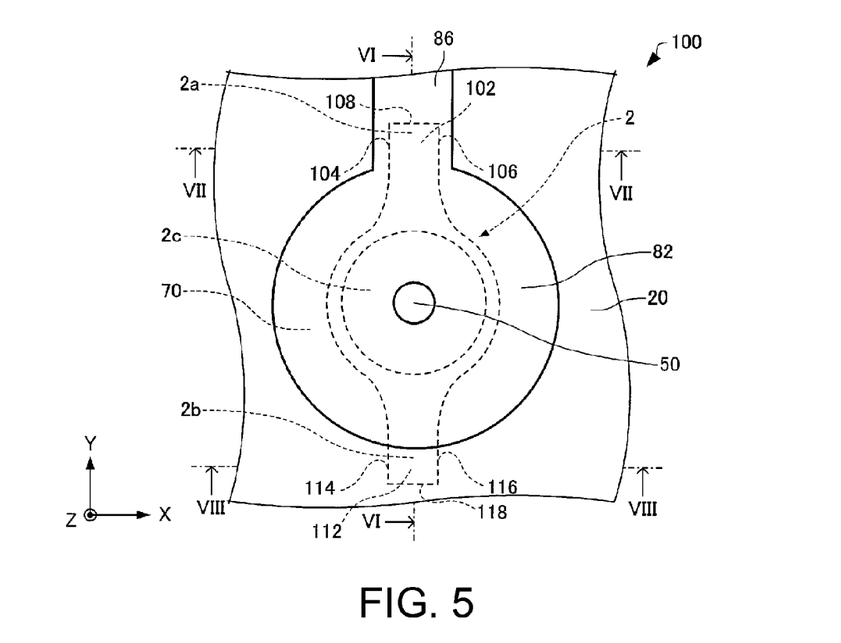
FIG. 5 is a plan view schematically showing the vertical cavity surface emitting laser according to the embodiment.
Figure 6:
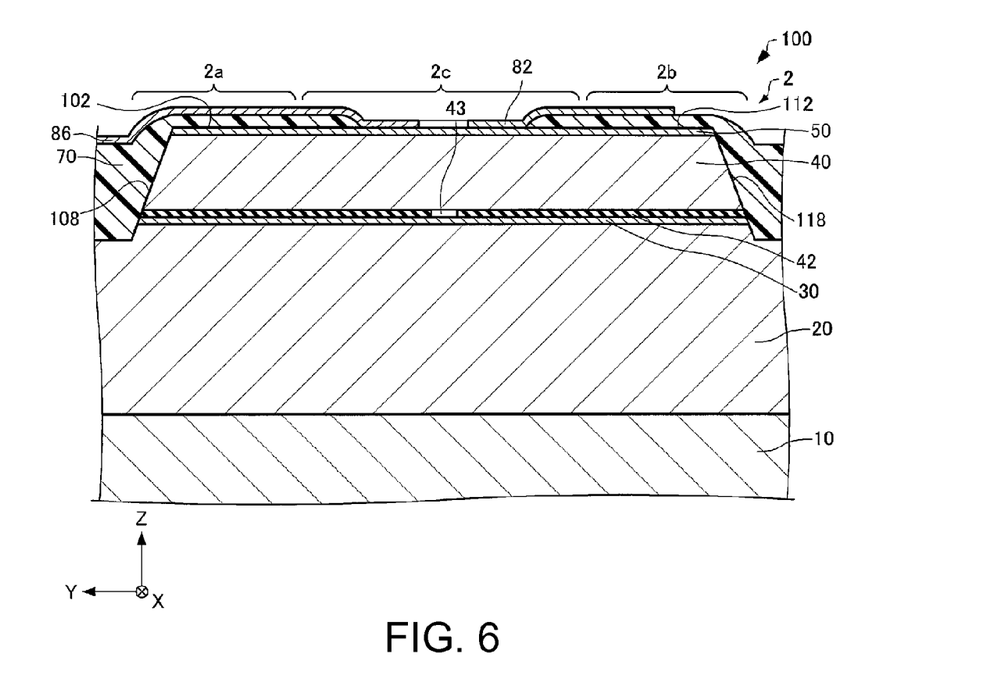
FIG. 6 is a cross-sectional view schematically showing the vertical cavity surface emitting laser according to the embodiment.
Figure 7:
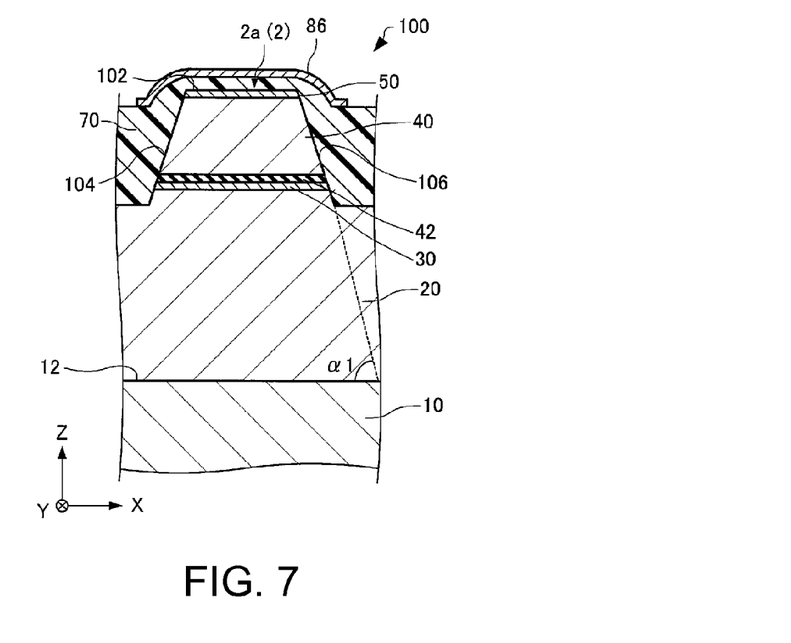
FIG. 7 is a cross-sectional view schematically showing the vertical cavity surface emitting laser according to the embodiment.
Figure 8:
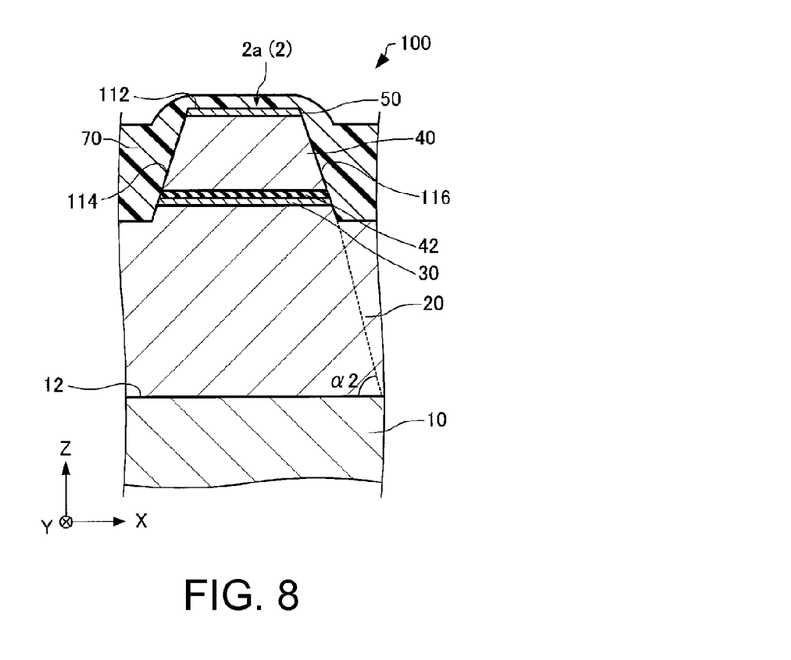
FIG. 8 is a cross-sectional view schematically showing the vertical cavity surface emitting laser according to the embodiment.

Herein, the laminated body 2 and the resin layer 70 will be described in detail. FIG. 5 is a plan view schematically showing the vertical cavity surface emitting laser 100 and is an enlarged view of the vicinity of the laminated body 2 shown in FIG. 2. FIG. 6 is a cross-sectional view which is taken along line VI-VI of FIG. 5 and schematically shows the vertical cavity surface emitting laser 100. FIG. 7 is a cross-sectional view which is taken along line VII-VII of FIG. 5 and schematically shows the vertical cavity surface emitting laser 100. FIG. 8 is a cross-sectional view which is taken along line VIII-VIII of FIG. 5 and schematically shows the vertical cavity surface emitting laser 100.

For the sake of convenience, FIGS. 5 to 8 show the simplified laminated body 2. FIGS. 5 to 8 show the X axis, the Y axis, and the Z axis as three axes orthogonal to each other.

The laminated body 2 is provided over the substrate 10. The laminated body 2 includes the first distortion imparting portion 2a having a first width (length in the X axis direction), the second distortion imparting portion 2b having a second width, and the resonance portion 2c having a third width wider than the first width and the second width. In the example shown in the drawing, the first width and the second width are the same width as each other.

The first width is, for example, a maximum width along the width of the first distortion imparting portion 2a, in a direction (X axis direction) orthogonal to a direction (Y axis direction) in which the first distortion imparting portion 2a and the second distortion imparting portion 2b face each other. The second width is, for example, a maximum width along the width of the second distortion imparting portion 2b, in the direction orthogonal to the direction in which the first distortion imparting portion 2a and the second distortion imparting portion 2b face each other. The third width is, for example, a maximum width along the width of the resonance portion 2c, in the direction orthogonal to the direction in which the first distortion imparting portion 2a and the second distortion imparting portion 2b face each other.

As shown in FIGS. 2, 7, and 8, an angle $\alpha 1$ formed by a side surface 106 (or side surface 104) of the first distortion imparting portion 2a and an upper surface 12 of the substrate 10 is greater than an angle $\beta$ formed by a side surface 64 of the resonance portion 2c and the upper surface 12 of the substrate 10. In addition, an angle $\alpha 2$ formed by a side surface 116 (or side surface 114) of the second distortion imparting portion 2b and the upper surface 12 of the substrate 10 is greater than the angle $\beta$ formed by the side surface 64 of the resonance portion 2c and the upper surface 12 of the substrate 10.

As shown in FIGS. 5 to 8, the first distortion imparting portion 2a includes an upper surface 102, the side surface 104, the side surface 106, and a side surface 108. The side surface 104, the side surface 106, and the side surface 108 are connected to the upper surface 102. The side surface 104 is a side surface of the first distortion imparting portion 2a on the negative X axis direction side. The side surface 106 is a side surface of the first distortion imparting portion 2a on the positive X axis direction side. The side surface 108 is a side surface of the first distortion imparting portion 2a on the positive Y axis direction side. The side surface 108 is connected to the side surface 104 and the side surface 106.

As shown in FIGS. 5 to 8, the first distortion imparting portion 2a is configured to include at least a part of the first mirror layer 20. In the example shown in FIGS. 5 to 8, the first distortion imparting portion 2a is configured to include a part of the first mirror layer 20, the active layer 30, the second mirror layer 40, the current constriction layer 42, the contact layer 50, the first areas 60, and the second areas 62.

The second distortion imparting portion 2b includes an upper surface 112, the side surface 114, the side surface 116, and the side surface 118. The side surface 114, the side surface 116, and the side surface 118 are connected to the upper surface 112. The side surface 114 is a side surface of the second distortion imparting portion 2b on the negative X axis direction side. The side surface 116 is a side surface of the second distortion imparting portion 2b on the positive X axis direction side. The side surface 118 is a side surface of the second distortion imparting portion 2b on the negative Y axis direction side. The side surface 118 is connected to the side surface 114 and the side surface 116.

As shown in FIGS. 5 to 8, the second distortion imparting portion 2b is configured to include at least a part of the first mirror layer 20. In the example shown in FIGS. 5 to 8, the second distortion imparting portion 2b is configured to include apart of the first mirror layer 20, the active layer 30, the second mirror layer 40, the current constriction layer 42, the contact layer 50, the first areas 60, and the second areas 62.

The resin layer 70 covers at least a portion of the first distortion imparting portion 2a. That is, the resin layer 70 is provided on at least the upper surface 102 of a portion of the first distortion imparting portion 2a, at least the side surface 104 of a portion of the first distortion imparting portion 2a, and at least the side surface 106 of a portion of the first distortion imparting portion 2a. In the example shown in the drawing, the resin layer 70 covers the entire first distortion imparting portion 2a. Specifically, the resin layer 70 is provided on the entire upper surface 102, the entire side surface 104, the entire side surface 106, and the entire side surface 108.

The resin layer 70 further covers at least a portion of the second distortion imparting portion 2b. That is, the resin layer 70 is provided on at least the upper surface 112 of a portion of the second distortion imparting portion 2b, at least the side surface 114 of a portion of the second distortion imparting portion 2b, and at least the side surface 116 of a portion of the second distortion imparting portion 2b. In the example shown in the drawing, the resin layer 70 covers the entire second distortion imparting portion 2b. Specifically, the resin layer 70 is provided on the entire upper surface 112, the entire side surface 114, the entire side surface 116, and the entire side surface 118.

In the example shown in the drawing, the resin layer 70 is provided on the entirety of side surfaces of the laminated body 2, at least a portion of the upper surface 102 of the first distortion imparting portion 2a (specifically, the entire portion thereof), and at least a portion of the upper surface 112 of the second distortion imparting portion 2b (specifically, the entire portion thereof).

The resin layer 70 is a resin which is hardened by applying heat, and contracts in a heating process (curing) of hardening the resin layer 70. In addition, the resin layer 70 contracts when returning the temperature in the heating process to a room temperature. A coefficient of thermal expansion of the resin layer 70 is greater than a coefficient of thermal expansion of the substrate 10 (approximately 6.5 when the substrate 10 is a GaAs substrate). Accordingly, the resin layer 70 easily contracts more than the substrate 10.

In the above description, the AlGaAs vertical cavity surface emitting laser has been described, but GaInP, ZnSSe, InGaN, AlGaN, InGaAs, GaInNAs, or GaAsSb semiconductor materials may be used according to the oscillation wavelength, for the vertical cavity surface emitting laser according to the invention.

The vertical cavity surface emitting laser 100, for example, has the following characteristics.

In the vertical cavity surface emitting laser 100, since the angle $\alpha 1$ formed by the side surface 106 of the first distortion imparting portion 2a and the upper surface 12 of the substrate 10 and the angle $\alpha 2$ formed by the side surface 116 of the second distortion imparting portion 2b and the upper surface 12 of the substrate 10 are greater than the angle $\beta$ formed by the side surface 64 of the resonance portion 2*c* and the upper surface 12 of the substrate 10, it is possible to increase the stress to be applied to the resonance portion 2*c* by the first distortion imparting portion 2*a* and the second distortion imparting portion 2*b*, and thus it is possible to generate a large amount of distortion to the active layer 30 of the resonance portion 2*c*. Therefore, in the vertical cavity surface emitting laser 100, it is possible to stabilize a polarization direction of laser light.

In the vertical cavity surface emitting laser 100, since the first distortion imparting portion 2*a* and the second distortion imparting portion 2*b* include at least a part of the first mirror layer 20, it is possible to increase the stress to be applied to the resonance portion 2*c* by the first distortion imparting portion 2*a* and the second distortion imparting portion 2*b*, and thus it is possible to generate a large amount of distortion to the active layer 30 of the resonance portion 2*c*. Therefore, in the vertical cavity surface emitting laser 100, it is possible to stabilize the polarization direction of the laser light.

In the vertical cavity surface emitting laser 100, the laminated body 2 includes the first distortion imparting portion 2*a*, the second distortion imparting portion 2*b*, and the resonance portion 2*c*, and the resin layer 70 which covers at least a portion of the first distortion imparting portion 2*a* is provided. Herein, the resin layer 70 is a resin which is hardened by applying heat, and contracts in a heating process (curing) of hardening the resin layer 70. In addition, the resin layer 70 contracts when returning the temperature in the heating process to a room temperature. In the vertical cavity surface emitting laser 100, it is possible to increase the stress to be applied to the resonance portion 2*c* by the first distortion imparting portion 2*a* with this contraction of the resin layer 70, and it is possible to generate a large amount of distortion in the active layer 30 of the resonance portion 2*c*. Accordingly, in the vertical cavity surface emitting laser 100, it is possible to stabilize the polarization direction of the laser light.

As described above, in the vertical cavity surface emitting laser 100, since it is possible to stabilize the polarization direction of the laser light, it is possible to stably emit circularly polarized light to a gas cell through a λ/4 plate, when the vertical cavity surface emitting laser 100 is used as a light source of an atomic oscillator, for example. As a result, it is possible to increase frequency stability of the atomic oscillator. For example, when the polarization direction of the laser light emitted from the vertical cavity surface emitting laser is not stable, the light obtained through the λ/4 plate may be elliptically polarized light or a rotation direction of the circularly polarized light may be fluctuated.

As described above, in the vertical cavity surface emitting laser 100, since it is possible to stabilize the polarization direction of the laser light, it is possible to stably emit the circularly polarized light to the gas cell through the λ/4 plate, and to increase the frequency stability of the atomic oscillator.

In the vertical cavity surface emitting laser 100, the resin layer 70 covers the entire first distortion imparting portion 2*a*. Accordingly, in the vertical cavity surface emitting laser 100, it is possible to increase the stress to be applied to the resonance portion 2*c* by the first distortion imparting portion 2*a*, compared to a case where the resin layer 70 only covers apart of the first distortion imparting portion 2*a*.

In the vertical cavity surface emitting laser 100, the resin layer 70 is provided on the entire upper surface 102 of the first distortion imparting portion 2*a* and the entire upper surface 112 of the second distortion imparting portion 2*b*. Accordingly, in the vertical cavity surface emitting laser 100, it is possible to increase the stress to be applied to the resonance portion 2*c* by the first distortion imparting portion 2*a* and the second distortion imparting portion 2*b*, compared to a case where the resin layer 70 only covers a portion of the upper surfaces 102 and 112.

2. Manufacturing Method of Vertical Cavity Surface Emitting Laser

Next, a manufacturing method of the vertical cavity surface emitting laser according to the embodiment will be described with reference to the drawings. FIGS. 9 to 13 are cross-sectional views schematically showing manufacturing steps of the vertical cavity surface emitting laser 100 according to the embodiment, and correspond to FIG. 2.

Figure 9:
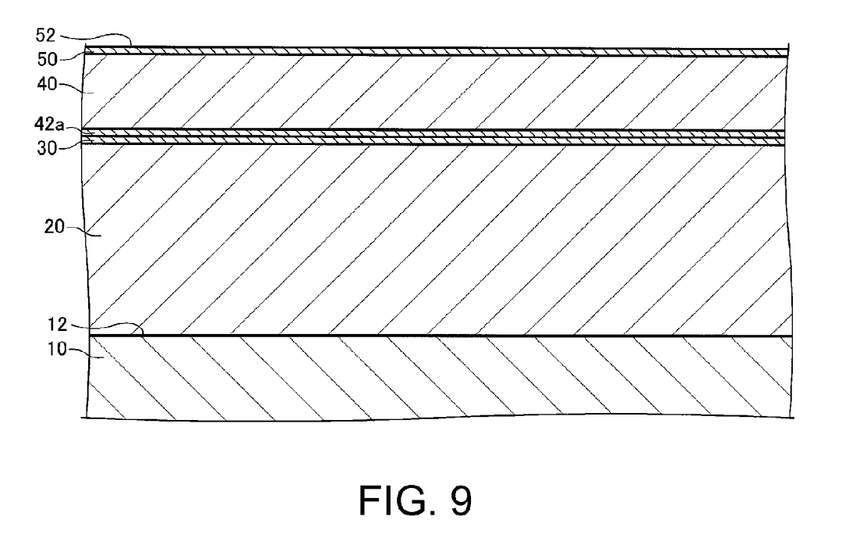
FIG. 9 is a cross-sectional view schematically showing a manufacturing step of the vertical cavity surface emitting laser according to the embodiment.

As shown in FIG. 9, the first mirror layer 20, the active layer 30, the layer to be oxidized 42*a* which is to be the oxidized current constriction layer 42, the second mirror layer 40, and the contact layer 50 are epitaxially grown in this order, on the substrate 10. As an epitaxial growth method, a metal organic chemical vapor deposition (MOCVD) method or a molecular beam epitaxy (MBE) method is used, for example.

Figure 10:
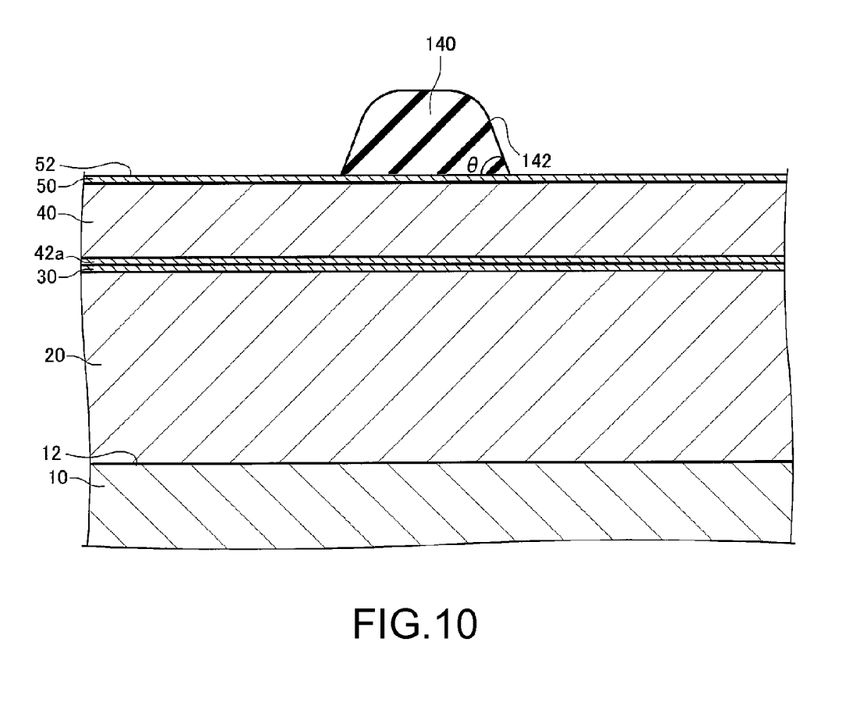
FIG. 10 is a cross-sectional view schematically showing a manufacturing step of the vertical cavity surface emitting laser according to the embodiment.

As shown in FIG. 10, a resist layer 140 having a predetermined shape is formed. The resist layer 140 is, for example, formed by forming a resist layer (not shown) having a predetermined shape on the contact layer 50 by photolithography and performing thermal treatment (reflow) of the resist layer. By this thermal treatment, the resist layer 140 having a side surface 142 inclined to an upper surface 52 of the contact layer 50 can be formed. That is, the tapered resist layer 140 can be formed. In the resist layer (not shown) before the thermal treatment, the portions corresponding to the resonance portion 2*c*, the first distortion imparting portion 2*a*, and the second distortion imparting portion 2*b* are formed. By performing the thermal treatment of these portions, the side surface 142 of the portion of the resist layer 140 corresponding to the first distortion imparting portion 2*a* and the second distortion imparting portion 2*b*, and the side surface 142 of the portion of the resist layer 140 corresponding to the resonance portion 2*c* are formed with different angles. An angle θ formed by the side surface 142 and the upper surface 52 of the contact layer 50 is an acute angle. A temperature of the thermal treatment is, for example, approximately 150° C. and the time of the thermal treatment is, for example, approximately 10 minutes. As the resist layer 140, TSMR-8900 is used, for example. It is possible to control a size of the angle θ by controlling the width of the resist layer 140, and the temperature and the time of the thermal treatment.

Figure 11:
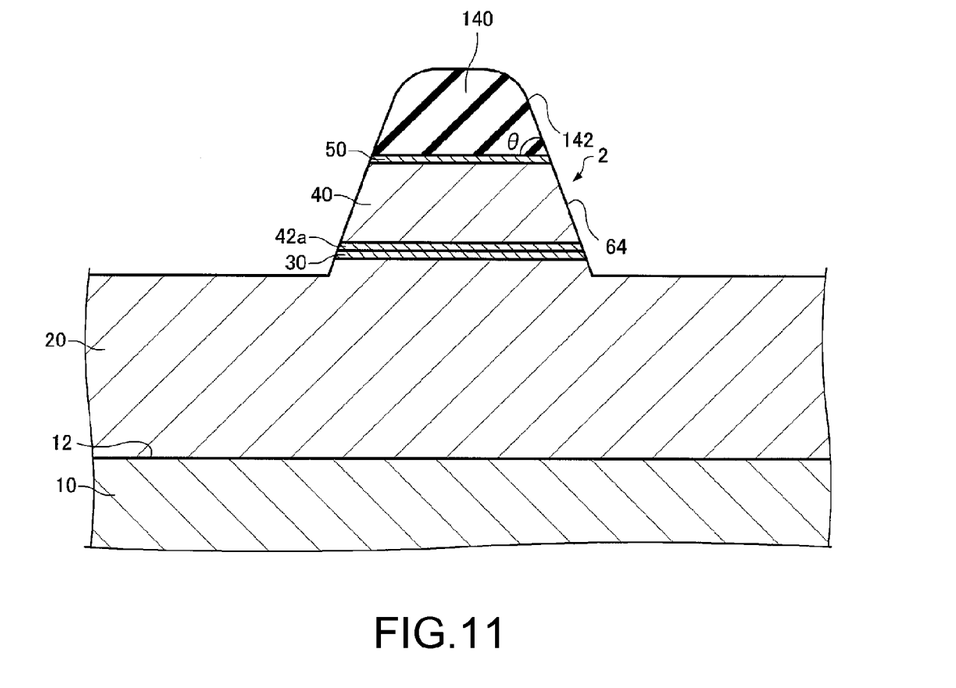
FIG. 11 is a cross-sectional view schematically showing a manufacturing step of the vertical cavity surface emitting laser according to the embodiment.

As shown in FIG. 11, the contact layer 50, the second mirror layer 40, the layer to be oxidized 42*a*, the active layer 30, and the first mirror layer 20 are etched using the resist layer 140 as a mask. Accordingly, the laminated body 2 can be formed. Etching is performed by dry etching. By performing dry etching using the tapered resist layer 140 as a mask, the side surface of the laminated body 2 (in examples shown in FIGS. 11 to 13, side surface 64 of the resonance portion 2*c*) can be inclined to the upper surface 12 of the substrate 10. The size of the angle formed by the side surface of the laminated body 2 and the upper surface 12 of the substrate 10 depends on the size of the angle θ formed by the side surface 142 of the resist layer 140 and the upper surface 52 of the contact layer 50.

Accordingly, it is possible to control the size of the angle formed by the side surface of the laminated body 2 and the upper surface 12 of the substrate 10, by controlling the width of the resist layer 140 for forming the tapered resist layer 140 and the temperature and the time of the thermal treatment.

The method of forming the tapered resist layer 140 is not limited to the thermal treatment described above. For example, by performing the exposure of the photolithography for forming the resist layer 140 by defocusing, the tapered resist layer 140 may be formed. This method is effective particularly in a case of avoiding a high temperature process.

Next, the resist layer 140 is removed by the well-known method, for example.

Figure 12:
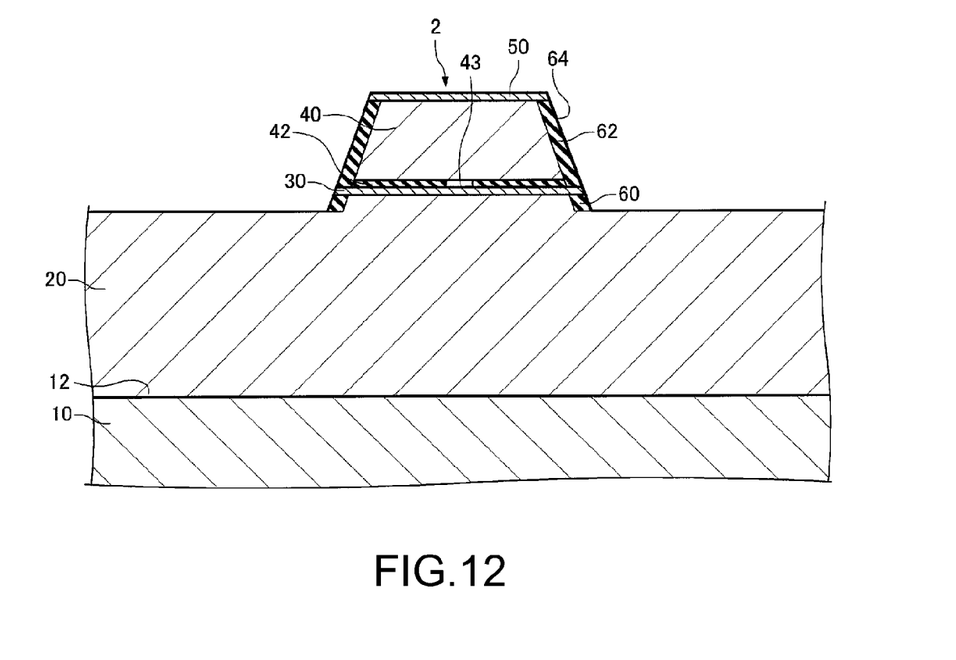
FIG. 12 is a cross-sectional view schematically showing a manufacturing step of the vertical cavity surface emitting laser according to the embodiment.

As shown in FIG. 12, the layer to be oxidized 42a is oxidized to form the current constriction layer 42. The layer to be oxidized 42a is, for example, an $Al_xGa_{1-x}As$ (x≥0.95) layer. The substrate 10 on which the laminated body 2 is formed is put in a steam atmosphere at approximately 400° C., to oxidize the $Al_xGa_{1-x}As$ (x≥0.95) layer from the lateral side, and accordingly the current constriction layer 42 is formed.

In the manufacturing method of the vertical cavity surface emitting laser 100, in the oxidization step, a layer configuring the first mirror layer 20 is oxidized from the lateral side to form the first area 60. A layer configuring the second mirror layer 40 is oxidized from the lateral side to form the second area 62. Specifically, due to the steam atmosphere at approximately 400° C., arsenic in the $Al_{0.9}Ga_{0.1}As$ layer configuring the first mirror layer 20 and the second mirror layer 40 is substituted with oxygen, and the first area 60 and the second area 62 are formed. The first area 60 and the second area 62, for example, contract when returning the temperature from the high temperature of approximately 400° C. to the room temperature, and the upper surface 63 of the second area 62 is inclined to the substrate 10 side (see FIG. 4). The first distortion imparting portion 2a and the second distortion imparting portion 2b can apply distortion (stress) caused by the contraction of the first area 60 and the second area 62 to the active layer 30.

Figure 13:
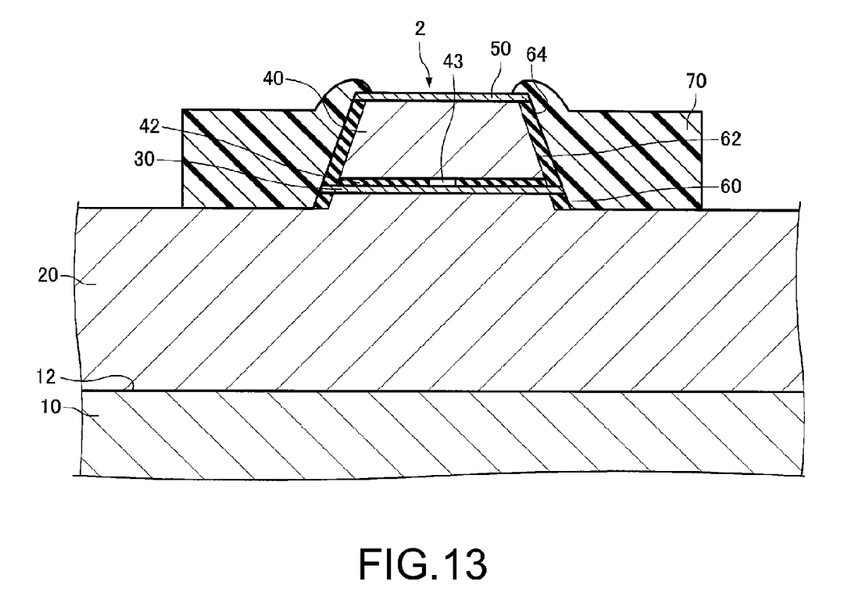
FIG. 13 is a cross-sectional view schematically showing a manufacturing step of the vertical cavity surface emitting laser according to the embodiment.

As shown in FIG. 13, the resin layer 70 is formed so as to surround the laminated body 2. The resin layer 70 is formed, for example, by forming a layer formed of a polyimide resin on the upper surface of the first mirror layer 20 and the entire surface of the laminated body 2 using a spin coating method and patterning the layer. The patterning is performed by photolithography and etching, for example.

As shown in FIG. 2, the second electrode 82 is formed on the contact layer 50 and the resin layer 70, and the first electrode 80 is formed on the first mirror layer 20. The first electrode 80 and the second electrode 82 are, for example, formed by a combination of a vacuum vapor deposition method and a lift-off method. The order of forming the first electrode 80 and the second electrode 82 is not particularly limited. In the step of forming the second electrode 82, the pad 84 and the lead-out wiring 86 (see FIG. 1) may be formed.

It is possible to manufacture the vertical cavity surface emitting laser 100 with the steps described above.

3. Atomic Oscillator

Figure 14:
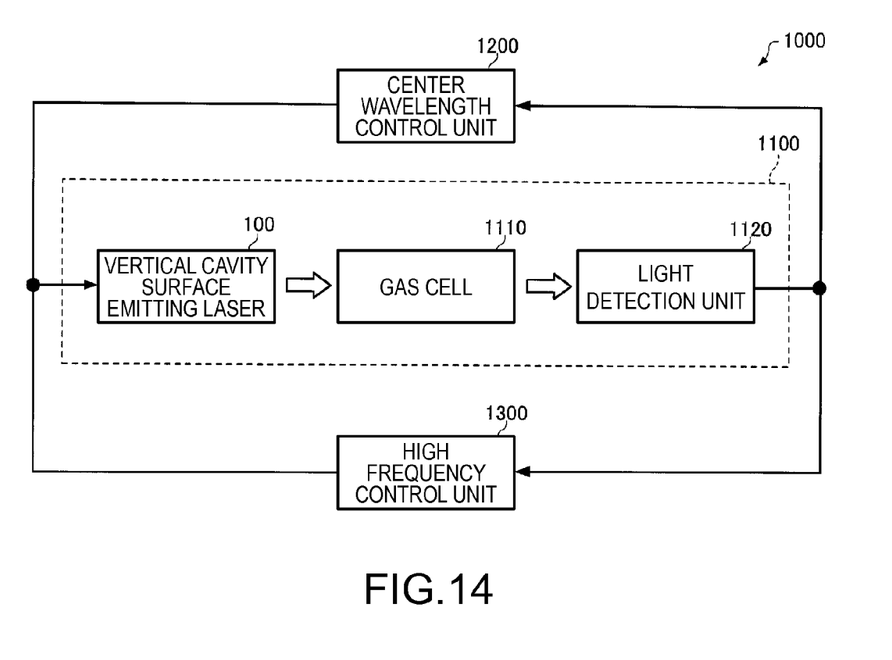
FIG. 14 is a functional block diagram of an atomic oscillator according to the embodiment.

Next, an atomic oscillator according to the embodiment will be described with reference to the drawings. FIG. 14 is a functional block diagram of an atomic oscillator 1000 according to the embodiment.

As shown in FIG. 14, the atomic oscillator 1000 is configured to include an optical module 1100, a center wavelength control unit 1200, and a high frequency control unit 1300.

The optical module 1100 includes the vertical cavity surface emitting laser according to the invention (in the example shown in the drawing, the vertical cavity surface emitting laser 100), a gas cell 1110, and a light detection unit 1120.

Figure 15:
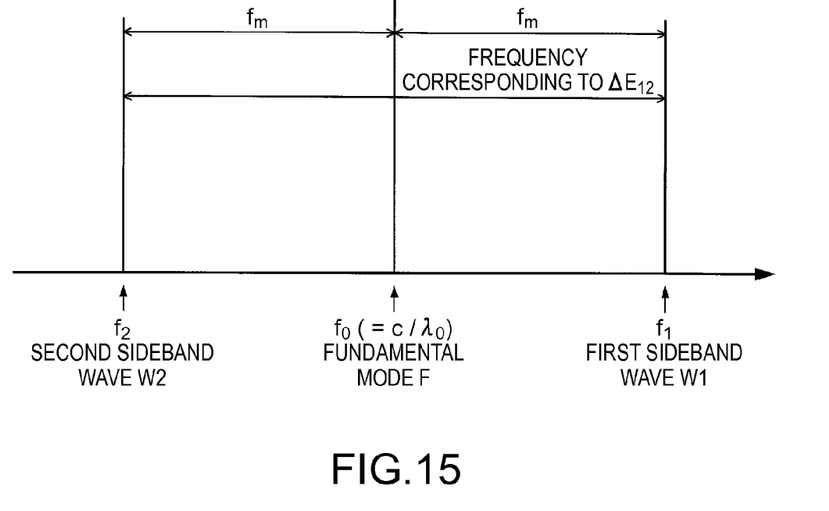
FIG. 15 is a view showing frequency spectra of resonant light.
Figure 16:
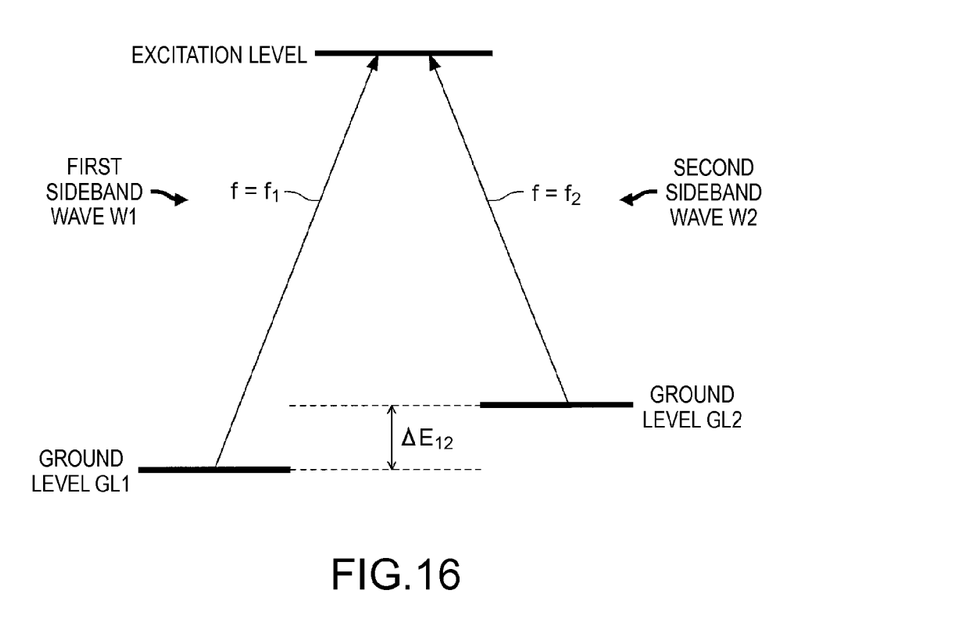
FIG. 16 is a view showing a relationship between Λ-shaped three level models of an alkaline metal atom, a first sideband wave, and a second sideband wave.

FIG. 15 is a view showing frequency spectra of light emitted by the vertical cavity surface emitting laser 100. FIG. 16 is a view showing a relationship between Λ-shaped three level models of an alkaline metal atom, a first sideband wave W1, and a second sideband wave W2. The light emitted from the vertical cavity surface emitting laser 100 includes a fundamental mode F including a center frequency $F_0$ (=c/$\lambda_0$: c represents velocity of light and $\lambda_0$ represents a center wavelength of laser light), the first sideband wave W1 including a frequency $f_1$ in an upstream sideband with respect to the center frequency $F_0$, and the second sideband wave W2 including a frequency $f_2$ in an downstream sideband with respect to the center frequency $F_0$, shown in FIG. 15. The frequency $f_1$ of the first sideband wave W1 satisfies $f_1=f_0+f_m$, and the frequency $f_2$ of the second sideband wave W2 satisfies $f_2=f_0-f_m$.

As shown in FIG. 16, a difference in frequencies between the frequency $f_1$ of the first sideband wave W1 and the frequency $f_2$ of the second sideband wave W2 coincides with a frequency corresponding to a difference in energy $\Delta E_{12}$ between a ground level GL1 and a ground level GL2 of the alkaline metal atom. Accordingly, the alkaline metal atom causes an EIT phenomenon to occur due to the first sideband wave W1 including the frequency $f_1$ and the second sideband wave W2 including the frequency $f_2$.

In the gas cell 1110, a gaseous alkaline metal atom (sodium atom, rubidium atom, cesium atom, and the like) is sealed in a container. When two light waves including the frequency (wavelength) corresponding to the difference in energy between two ground levels of the alkaline metal atom is emitted to the gas cell 1110, the alkaline metal atom causes the EIT phenomenon to occur. For example, if the alkaline metal atom is a sodium atom, the frequency corresponding to the difference in energy between the ground level GL1 and the ground level GL2 in a D1 line is 9.19263 . . . GHz. Accordingly, when two light waves including the difference in frequency of 9.19263 . . . GHz is emitted, the EIT phenomenon occurs.

The light detection unit 1120 detects the intensity of the light penetrating the alkaline metal atom sealed in the gas cell 1110. The light detection unit 1120 outputs a detection signal according to the amount of the light penetrating the alkaline metal atom. As the light detection unit 1120, a photodiode is used, for example.

The center wavelength control unit 1200 generates driving current having a magnitude corresponding to the detection signal output by the light detection unit 1120, supplies the driving current to the vertical cavity surface emitting laser 100, and controls the center wavelength $\lambda_0$ of the light emitted by the vertical cavity surface emitting laser 100. The center wavelength $\lambda_0$ of the laser light emitted by the vertical cavity surface emitting laser 100 is minutely adjusted and stabilized, by a feedback loop passing through the vertical cavity surface emitting laser 100, the gas cell 1110, the light detection unit 1120, and the center wavelength control unit 1200.

The high frequency control unit 1300 controls so that the difference in wavelengths (frequencies) between the first sideband wave W1 and the second sideband wave W2 is equivalent to the frequency corresponding to the difference in energy between two ground levels of the alkaline metal atom sealed in the gas cell 1110, based on the detection result output by the light detection unit 1120. The high frequency control unit 1300 generates a modulation signal including a modulation frequency $f_m$ (see FIG. 15) according to the detection result output by the light detection unit 1120.

Feedback control is performed so that the difference in frequencies between the first sideband wave W1 and the second sideband wave W2 is extremely accurately equivalent to the frequency corresponding to the difference in energy between two ground levels of the alkaline metal atom, by a feedback loop passing through the vertical cavity surface emitting laser 100, the gas cell 1110, the light detection unit 1120, and the high frequency control unit 1300. As a result, the modulation frequency $f_m$ becomes an extremely stabilized frequency, and therefore, the modulation signal can be set as an output signal (clock signal) of the atomic oscillator 1000.

Next, the operations of the atomic oscillator 1000 will be described with reference to FIGS. 14 to 16.

The laser light emitted from the vertical cavity surface emitting laser 100 is incident on the gas cell 1110. The light emitted from the vertical cavity surface emitting laser 100 includes two light waves (the first sideband wave W1 and the second sideband wave W2) including the frequency (wavelength) corresponding to the difference in energy between two ground levels of the alkaline metal atom, and the alkaline metal atom causes the EIT phenomenon to occur. The intensity of the light penetrating the gas cell 1110 is detected by the light detection unit 1120.

The center wavelength control unit 1200 and the high frequency control unit 1300 perform the feedback control so that the difference in frequencies between the first sideband wave W1 and the second sideband wave W2 extremely accurately coincides with the frequency corresponding to the difference in energy between two ground levels of the alkaline metal atom. In the atomic oscillator 1000, a rapid change in a light absorbing behavior when the difference in frequencies $f_1$-$f_2$ between the first sideband wave W1 and the second sideband wave W2 is deviated from the frequency corresponding to the difference in energy $\Delta E_{12}$ between the ground level GL1 and the ground level GL2, is detected and controlled using the EIT phenomenon, and therefore it is possible to obtain an oscillator with high accuracy.

The embodiments and the modification examples are merely examples, and there is no limitation. For example, embodiments and the modification examples can also be suitably combined to each other.

The invention has configurations substantially same as the configurations described in the embodiments (for example, configurations with the same function, method, and effects, or configurations with the same object and effect). The invention includes a configuration in which non-essential parts of the configurations described in the embodiments are replaced. The invention includes a configuration having the same operation effect as the configurations described in the embodiments or a configuration which can achieve the same object. The invention includes a configuration obtained by adding a well-known technology to the configurations described in the embodiments.

The entire disclosure of Japanese Patent Application No. 2013-263461, filed Dec. 20, 2013 is expressly incorporated by reference herein.

What is claimed is:

1. A vertical cavity surface emitting laser comprising:
   a substrate;
   a laminated body which is provided over the substrate, the laminated body including a first mirror layer which is provided over the substrate, an active layer which is provided over the first mirror layer, and a second mirror layer which is provided over the active layer;
   an insulation layer provided on the first mirror layer and surrounding the laminated body,
   wherein, in a plan view, the laminated body includes a first distortion imparting portion, a second distortion imparting portion, and a resonance portion which is provided between the first distortion imparting portion and the second distortion imparting portion and resonates light generated by the active layer, and
   an angle formed by a side surface of the first distortion imparting portion and an upper surface of the substrate, and an angle formed by a side surface of the second distortion imparting portion and the upper surface of the substrate are greater than an angle formed by a side surface of the resonance portion and the upper surface of the substrate.

2. The vertical cavity surface emitting laser according to claim 1,
   wherein the first distortion imparting portion has a first width,
   the second distortion imparting portion has a second width, and
   the resonance portion has a third width greater than at least one of the first width and the second width.

3. An atomic oscillator comprising:
   the vertical cavity surface emitting laser according to claim 1.

4. An atomic oscillator comprising:
   the vertical cavity surface emitting laser according to claim 2.

* * * * *